US012578396B2

(12) United States Patent
Lee et al.

(10) Patent No.: US 12,578,396 B2
(45) Date of Patent: Mar. 17, 2026

(54) SYSTEM AND METHOD FOR MANAGING STATE OF BATTERY

(71) Applicant: LG ENERGY SOLUTION, LTD., Seoul (KR)

(72) Inventors: Hu-Jun Lee, Daejeon (KR);
Jung-Hyun Kwon, Daejeon (KR);
Ho-Byung Yoon, Daejeon (KR);
Sang-Hoon Lee, Daejeon (KR);
Hyun-Ki Cho, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 596 days.

(21) Appl. No.: 18/008,925

(22) PCT Filed: May 25, 2021

(86) PCT No.: PCT/KR2021/006520
§ 371 (c)(1),
(2) Date: Dec. 7, 2022

(87) PCT Pub. No.: WO2021/261781
PCT Pub. Date: Dec. 30, 2021

(65) Prior Publication Data
US 2023/0236263 A1 Jul. 27, 2023

(30) Foreign Application Priority Data

Jun. 22, 2020 (KR) ......................... 10-2020-0075741

(51) Int. Cl.
*G01R 31/396* (2019.01)
*G01R 31/382* (2019.01)
(Continued)

(52) U.S. Cl.
CPC ......... *G01R 31/396* (2019.01); *G01R 31/382* (2019.01); *G01R 31/392* (2019.01); *H01M 10/425* (2013.01); *H01M 2010/4271* (2013.01)

(58) Field of Classification Search
None
See application file for complete search history.

(56) References Cited

U.S. PATENT DOCUMENTS 11,370,322 B2 * 6/2022 Benane ................... B60L 58/16
2008/0294380 A1 11/2008 Ito et al.
(Continued)

FOREIGN PATENT DOCUMENTS

JP 2008-76204 A 4/2008
JP 2009-244025 A 10/2009
(Continued)

OTHER PUBLICATIONS

International Search Report for PCT/KR2021/006520 (PCT/ISA/210) mailed on Sep. 23, 2021.

*Primary Examiner* — Kevin M Bernatz
(74) *Attorney, Agent, or Firm* — Birch, Stewart, Kolasch & Birch, LLP

(57) ABSTRACT

Discussed is a system for managing a state of a battery, the system including: a user terminal to set location information about a location at which the battery is stored and output the set location information; a battery information obtaining device connected to the battery and to obtain battery information including at least one of voltage, SOC, and SOH of the battery and output the obtained battery information; and a performance detecting device connected to the user terminal to receive the set location information, connected to the battery information obtaining device to receive the obtained battery information, and to determine a target location at which the battery is stored, obtain environment information of the determined target location, set reference (Continued)

SECOND STATE PROFILE(P2)

state information of at least one reference cell stored around the determined target location, and detect performance of the battery.

15 Claims, 4 Drawing Sheets

(51) Int. Cl.
    *G01R 31/392*     (2019.01)
    *H01M 10/42*     (2006.01)

(56)          References Cited

U.S. PATENT DOCUMENTS

| | | | |
|---|---|---|---|
| 2012/0001746 A1 | 1/2012 | Kamiya | |
| 2012/0228946 A1 | 9/2012 | Sim et al. | |
| 2017/0144560 A1* | 5/2017 | Park | B60L 58/10 |
| 2017/0182906 A1 | 6/2017 | Park et al. | |
| 2017/0307694 A1* | 10/2017 | Matsumura | G01S 19/42 |
| 2019/0033381 A1 | 1/2019 | Karner et al. | |
| 2020/0164763 A1* | 5/2020 | Holme | B60L 58/16 |
| 2020/0348364 A1* | 11/2020 | Guo | G01R 31/367 |
| 2021/0005066 A1* | 1/2021 | Molchadsky | G01R 31/36 |
| 2021/0344212 A1* | 11/2021 | Jee | G01R 31/367 |
| 2022/0113356 A1* | 4/2022 | Kasselman | H01M 10/482 |
| 2022/0292441 A1* | 9/2022 | Morita | G06Q 50/04 |
| 2023/0014216 A1* | 1/2023 | Pan | H01M 10/48 |
| 2023/0132798 A1* | 5/2023 | Zomorodi Moghadam | H02J 7/0047 320/104 |
| 2024/0012064 A1* | 1/2024 | Lee | G01R 31/367 |

FOREIGN PATENT DOCUMENTS

| | | |
|---|---|---|
| JP | 2011-27435 A | 2/2011 |
| JP | 5327151 B2 | 10/2013 |
| JP | 2016-46960 A1 | 4/2016 |
| KR | 10-1180810 B1 | 9/2012 |
| KR | 10-2017-0060516 A | 6/2017 |
| KR | 10-2017-0076414 A | 7/2017 |
| KR | 10-2079875 B1 | 2/2020 |
| KR | 10-2020-0038267 A | 4/2020 |
| WO | WO 2017/154170 A1 | 9/2017 |
| WO | WO 2018/167888 A1 | 9/2018 |
| WO | WO 2019/023872 A1 | 1/2019 |

* cited by examiner

100

```
APPARATUS FOR MANAGING
    STATE OF BATTERY

USER TERMINAL          ~110

BATTERY INFORMATION       ~120
   OBTAINING DEVICE

PERFORMANCE DETECTING     ~130
       DEVICE

ENVIRONMENT INFORMATION    ~140
   MEASURING DEVICE

STORAGE DEVICE         ~150
```

200

SYSTEM AND METHOD FOR MANAGING STATE OF BATTERY

TECHNICAL FIELD

The present application claims priority to Korean Patent Application No. 10-2020-0075741 filed on Jun. 22, 2020 in the Republic of Korea, the disclosures of which are incorporated herein by reference.

The present disclosure relates to a system and method for managing a state of a battery, and more particularly, to a system and method for managing a state of a battery, which detects the performance of a battery in consideration of environment information of a storage location of the battery and surrounding battery information.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

These batteries have different characteristics when they are produced, and the rate of degradation according to the environment is different. Thus, it is necessary to analyze the performance of the battery in consideration of the environment information of the battery.

Conventionally, in the process of manufacturing and distributing a battery, the performance of a battery loaded for a long period of time may deteriorate due to environmental factors such as temperature and humidity and various other reasons such as self-discharge, but there is a limit in tracking and observing the same. Therefore, it is necessary to develop a technology that may accurately detect the performance of the battery in consideration of the environment information of a location where the battery is stored or loaded.

DISCLOSURE

Technical Problem

The present disclosure is designed to solve the problems of the related art, and therefore the present disclosure is directed to providing a system and method for managing a state of a battery, which detects the performance of a battery in consideration of environment information of a storage location of the battery and surrounding battery information.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a system for managing a state of a battery, comprising: a user terminal configured to set location information about a location at which a battery is stored and output the set location information; a battery information obtaining device connected to the battery and configured to obtain battery information including at least one of voltage, SOC, and SOH of the battery and output the obtained battery information; and a performance detecting device connected to the user terminal to receive the set location information, connected to the battery information obtaining device to receive the battery information, and configured to determine a target location at which the battery is stored based on the received location information, obtain environment information of the determined target location, set reference state information of at least one reference cell stored around the determined target location, and detect performance of the battery based on at least one of the received battery information, the obtained environment information, and the set reference state information.

The performance detecting device may be configured to set a first state profile about a predicted state of the battery based on the received battery information and the obtained environment information, set a second state profile about the predicted state of the battery based on the set first state profile and the set reference state information, and detect the performance of the battery based on the set second state profile.

The performance detecting device may be configured to set the second state profile by correcting the set first state profile according to the reference state information.

The performance detecting device may be configured to set the second state profile at a first time point and detect the performance of the battery by comparing battery information received at a second time point later than the first time point with the predicted state of the second state profile corresponding to the second time point.

The performance detecting device may be configured to compare the set second state profile with a reference profile and detect the performance of the battery according to the comparison result.

The performance detecting device may be configured to determine the target location based on the received location information, determine at least one cell stored at the target location as the reference cell, and set reference state information corresponding to the determined reference cell.

The reference cell may be provided in plural.

The performance detecting device may be configured to obtain a plurality of reference information respectively corresponding to the plurality of reference cells, set the reference state information about the target location based on the plurality of obtained reference information, and set the second state profile according to the set first state profile and the set reference state information.

The user terminal may be configured to further set specification information about the battery.

The performance detecting device may be configured to receive the specification information from the user terminal and determine a cell having the same specification as the received specification information among the at least one cell stored at the target location as the reference cell.

The specification information may be configured to include at least one of battery type, manufacturer, active material composition, and manufacturing time.

The user terminal may be configured to further set a storage duration of the battery.

The battery information obtaining device may be configured to receive the set storage duration from the user terminal, set a wakeup period about the battery so that the battery information is obtained a predetermined number of measurement times during the set storage duration, and obtain the battery information by operating at every set wakeup period.

The user terminal may be configured to set a target section in which the battery is stored as the location information among a plurality of divided sections.

A system for managing a state of a battery according to another aspect of the present disclosure may further comprise an environment information measuring device configured to measure the environment information including at least one of temperature, humidity, and air quality of the target location, and transmit the measured environment information to the performance detecting device.

A method for managing a state of a battery according to still another aspect of the present disclosure may comprise: a location information setting step of setting location information about a location at which a battery is stored; a battery information obtaining step of obtaining battery information including at least one of voltage, SOC, and SOH of the battery; a target location determining step of determining a target location at which the battery is stored based on the location information set in the location information setting step; an environment information obtaining step of obtaining environment information of the determined target location; a reference state information setting step of setting reference state information of at least one reference cell stored around the determined target location; and a performance detecting step of detecting performance of the battery based on at least one of the battery information, the environment information, and the reference state information.

Advantageous Effects

According to one aspect of the present disclosure, the system for managing a state of a battery has an advantage of more accurately detecting the performance of the battery by considering not only battery information but also environment information about the target location at which the battery is stored and the reference state information of a reference cell stored at the target location.

In addition, according to one aspect of the present disclosure, the system for managing a state of a battery has an advantage of securing sufficient battery information for detecting the performance of the battery while reducing unnecessary power consumption.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
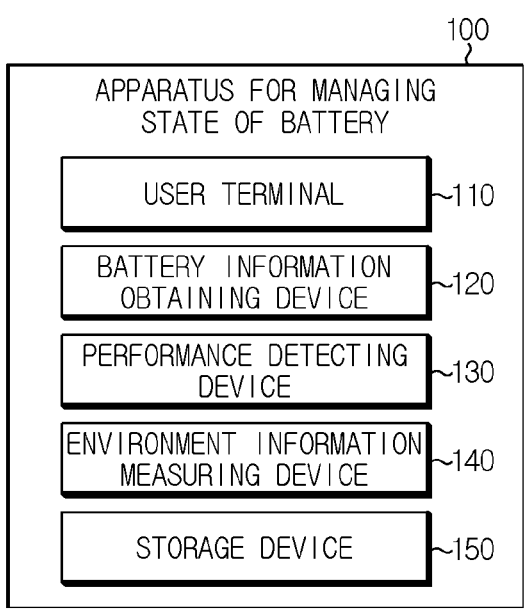
FIG. 1 is a diagram schematically showing a system for managing a state of a battery according to an embodiment of the present disclosure.

FIG. 1 is a diagram schematically showing a system 100 for managing a state of a battery according to an embodiment of the present disclosure.

Referring to FIG. 1, the system 100 for managing a state of a battery according to an embodiment of the present disclosure may include a user terminal 110, a battery information obtaining device 120, and a performance detecting device 130.

Here, the battery may refer to one independent battery cell that includes a negative electrode terminal and a positive electrode terminal and is physically separable. For example, one pouch-type lithium polymer cell may be regarded as a battery.

The user terminal 110 may be configured to set location information for the location where the battery is stored.

Specifically, the user terminal 110 may be configured to include an input unit. In addition, the user terminal 110 may receive information about the location where the battery is stored through the input unit. In addition, the user terminal 110 may set location information for a location where the battery is stored based on the received information.

For example, the user terminal 110 may be applied to various devices having an input unit, such as a mobile phone, a personal digital assistant (PDA), a personal computer (PC), and a tablet PC.

In addition, the user terminal 110 may be configured to output the set location information.

Specifically, the user terminal 110 may include a communication unit configured to enable wired communication and/or wireless communication. The user terminal 110 may output the set location information to the outside through the communication unit.

The battery information obtaining device 120 may be connected to the battery and may be configured to obtain battery information including at least one of a voltage, a state of charge (SOC), and a state of health (SOH) of the battery.

Specifically, the battery information obtaining device 120 may include a state measuring unit configured to measure the voltage and/or current of the battery. In addition, the battery information obtaining device 120 may include a state estimating unit capable of estimating the SOC and/or SOH of the battery based on the voltage and/or current of the battery measured by the measuring unit. That is, the battery information obtaining device 120 may obtain the voltage of the battery through the state measuring unit and may obtain the SOC and SOH of the battery through the state estimating unit.

Hereinafter, for convenience of description, it will be described that the battery information obtaining device 120 obtains at least one of voltage, SOC, and SOH of the battery. However, it should be noted that the battery information obtaining device 120 may further obtain various battery information that may be used to detect the performance of the battery, such as internal resistance, temperature, and swelling pressure.

In addition, the battery information obtaining device 120 may be configured to output the obtained battery information.

Specifically, the battery information obtaining device 120 may include a communication unit configured to enable wired communication and/or wireless communication. The battery information obtaining device 120 may output the obtained voltage, SOC, and/or SOH to the outside through the communication unit.

The performance detecting device 130 may be connected to the user terminal 110 to receive the set location information and may be connected to the battery information obtaining device 120 to receive the obtained battery information.

Specifically, the performance detecting device 130 may include a communication unit configured to enable wired communication and/or wireless communication.

For example, the communication unit of the performance detecting device 130 may be connected to be able to communicate with the communication unit of the user terminal 110 and the communication unit of the battery information obtaining device 120. In addition, the performance detecting device 130 may receive the set location information from the user terminal 110 and receive the obtained battery information from the battery information obtaining device 120 through the communication unit provided thereto.

Also, the performance detecting device 130 may be configured to determine a target location at which the battery is stored based on the received location information.

The target location of the battery determined by the performance detecting device 130 will be described in detail with reference to FIG. 2.

Figure 2:
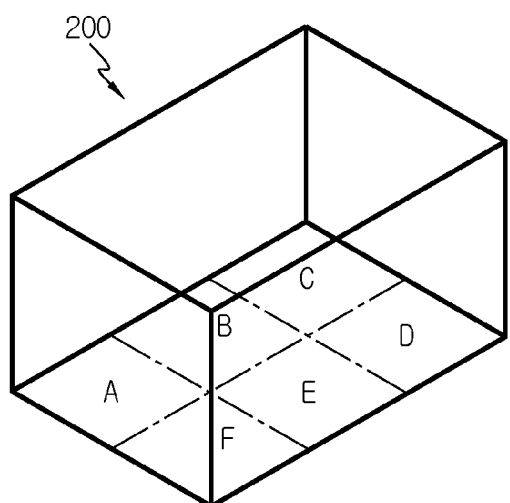
FIG. 2 is a diagram schematically showing a storage space in which a battery may be stored, in the system for managing a state of a battery according to an embodiment of the present disclosure.

FIG. 2 is a diagram schematically showing a storage space 20 in which a battery may be stored, in the system 100 for managing a state of a battery according to an embodiment of the present disclosure.

In the embodiment of FIG. 2, the battery may be stored in the storage space 200. Here, the storage space 200 may be a space, such as a warehouse, a container, a trailer, or the like, in which the battery may be stored or loaded. For example, the storage space 200 may be divided into an A section, a B section, a C section, a D section, an E section, and an F section. That is, the battery may be stored in any one of the A section, the B section, the C section, the D section, the E section, and the F section.

Preferably, the user terminal 110 may be configured to set a target section in which the battery is stored, as the location information among the plurality of divided sections.

For example, it is assumed that the battery is stored in the A section. In this case, the A section may be the target section. The user terminal 110 may set location information for the A section in which the battery is stored and transmit the set location information to the performance detecting device 130. The performance detecting device 130 may receive the location information from the user terminal 110 and determine the target location of the battery as the A section based on the received location information.

Also, the performance detecting device 130 may be configured to obtain environment information of the determined target location.

Referring to FIG. 1, the system 100 for managing a state of a battery according to an embodiment of the present disclosure may further include an environment information measuring device 140.

The environment information measuring device 140 may be configured to measure the environment information including at least one of temperature, humidity, and air quality of the target location. Here, the air quality may mean the concentration of pollutants in the air of the target location. Pollutants may include sulfur dioxide ($SO_2$), carbon monoxide (CO), nitrogen dioxide ($NO_2$), particulate matter ($PM_{10}$, $PM_{2.5}$), and the like.

In addition, the environment information measuring device 140 may be configured to communicate with the user terminal 110 and the performance detecting device 130.

Specifically, the environment information measuring device 140 may receive the location information in which the battery is stored from the user terminal 110. The environment information measuring device 140 may determine the target location in which the battery is stored based on the received location information. The environment information measuring device 140 may measure environment information including at least one of temperature, humidity, and air quality of the determined target location. In addition, the environment information measuring device 140 may transmit the measured environment information to the performance detecting device 130.

For example, as in the former embodiment, it is assumed that the battery is stored in the A section. The environment information measuring device 140 may determine the target location of the battery as the A section based on the location information received from the user terminal 110. In addition, the environment information measuring device 140 may measure environment information including at least one of temperature, humidity, and air quality of the A section. In addition, the environment information measuring device 140 may transmit the measured environment information to the performance detecting device 130.

Also, the performance detecting device 130 may be configured to set reference state information of at least one reference cell stored around the determined target location.

Here, the reference state information of the reference cell may be a profile indicating the degradation of the reference cell. Specifically, the reference state information may be a profile indicating a correspondence between at least one of voltage, SOC, and SOH of the reference cell and a storage time of the reference cell. The reference state information will be described later in detail with reference to FIG. 4.

For example, at least one cell may be stored in the storage space 200 in advance. In addition, the performance detecting device 130 may be configured to obtain in advance a storage location of the at least one cell and the state information of each cell previously stored in the storage space 200. Accordingly, the performance detecting device 130 may select at least one reference cell previously stored near the target location determined for the battery among the at least one cell previously stored in the storage space 200. In addition, the performance detecting device 130 may set the reference state information of the selected reference cell.

For example, as in the former embodiment, it is assumed that the battery is stored in the A section. The performance detecting device 130 may select at least one reference cell stored in the A section among at least one cell previously stored in the storage space 200. In addition, the performance detecting device 130 may set reference state information for each of the selected at least one reference cell. Preferably, the performance detecting device 130 may select all cells stored in the A section as reference cells among the at least one cell previously stored in the storage space 200.

Also, the performance detecting device 130 may be configured to detect the performance of the battery based on at least one of the received battery information, the obtained environment information, and the set reference state information.

Here, since the reference cell is a cell previously stored at the target location, the reference state information of the reference cell may be affected by the environment of the target location. For example, when the temperature of the target location exceeds the upper limit of the temperature range required for the battery, the reference cell may already be in a degraded state. In addition, the reference state information of the reference cell may correspond to a voltage profile of the cell degraded due to the influence of high temperature.

Therefore, the performance detecting device 130 may more accurately detect the performance of the battery by consider not only the battery information received from the battery information obtaining device 120 but also all of the environment information about the target location where the battery is stored and the reference state information of the reference cell stored at the target location.

Meanwhile, the performance detecting device 130 may optionally include a processor, an application-specific integrated circuit (ASIC), another chipset, a logic circuit, a register, a communication modem, and a data processing device, and the like, known in the art to execute various control logics disclosed below. In addition, when the control logic is implemented in software, the performance detecting device 130 may be implemented as a set of program units. At this time, the program unit may be stored in a memory and executed by the performance detecting device 130. The memory may be provided in or out of the performance detecting device 130 and may be connected to the performance detecting device 130 by various well-known means.

Also, the performance detecting device 130 may be configured as a server capable of executing various control logics. For example, the user terminal 110, the battery information obtaining device 120, and the environment information measuring device 140 are connected to the server, and the performance of the battery may be detected at the server.

Hereinafter, with reference to FIGS. 3 to 6, the content in which the performance detecting device 130 detects the performance of the battery will be described in detail.

Figure 3:
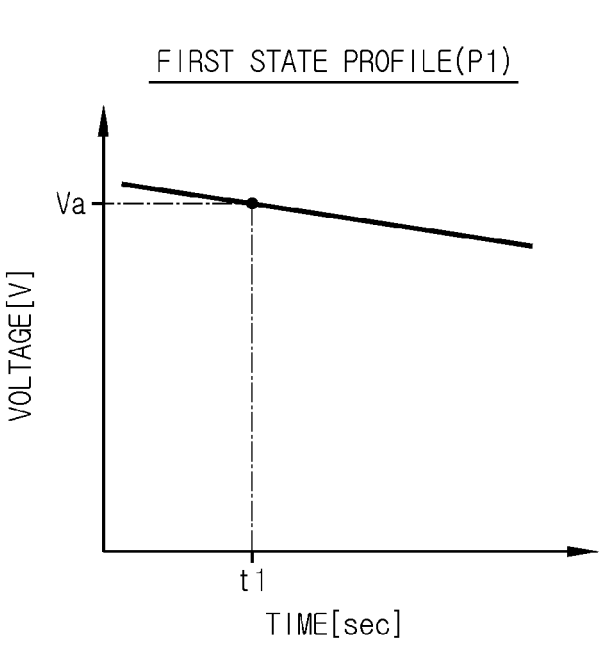
FIG. 3 is a diagram schematically showing an example of a first state profile, set by the system for managing a state of a battery according to an embodiment of the present disclosure.
Figure 4:
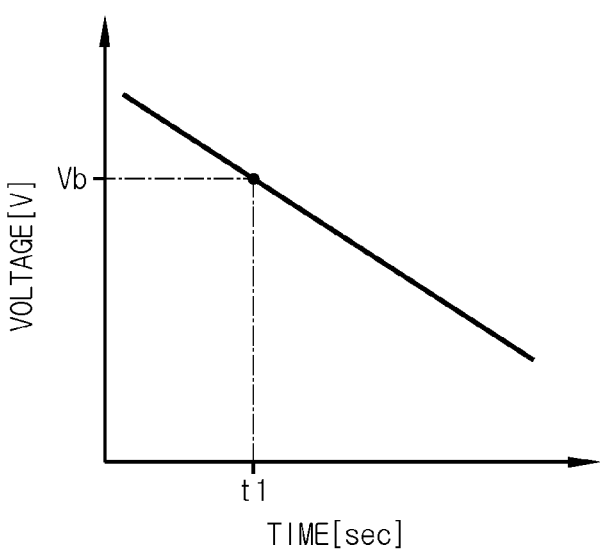
FIG. 4 is a diagram schematically showing an example of reference state information, set by the system for managing a state of a battery according to an embodiment of the present disclosure.
Figure 5:
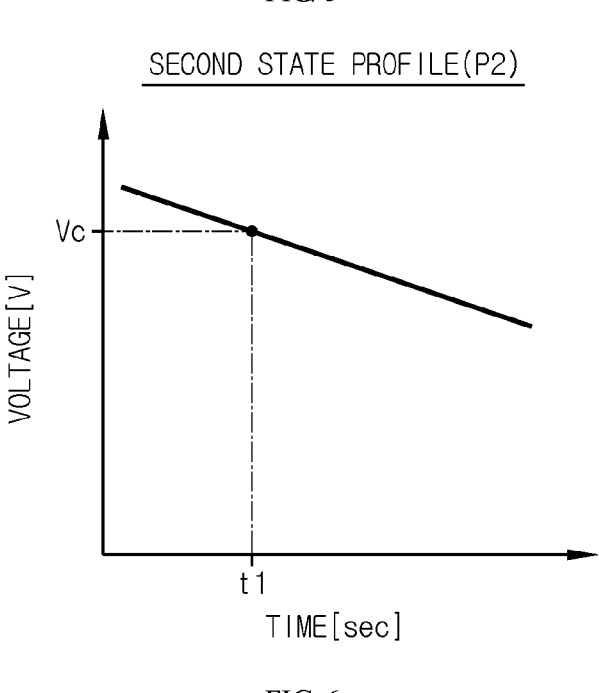
FIG. 5 is a diagram schematically showing an example of a second state profile, set by the system for managing a state of a battery according to an embodiment of the present disclosure.

FIG. 3 is a diagram schematically showing an example of a first state profile P1, set by the system 100 for managing a state of a battery according to an embodiment of the present disclosure. FIG. 4 is a diagram schematically showing an example of reference state information Pref, set by the system 100 for managing a state of a battery according to an embodiment of the present disclosure. FIG. 5 is a diagram schematically showing an example of a second state profile P2, set by the system 100 for managing a state of a battery according to an embodiment of the present disclosure.

The first state profile P1, the second state profile P2, and the reference state information Pref may be profiles indicating a correspondence between at least one of voltage, SOC, and SOH of the reference cell and the storage time of the reference cell. However, hereinafter, for convenience of explanation, the first state profile P1 and the second state profile P2 will be described as voltage profiles indicating a predicted voltage of the battery according to the storage time. In addition, the reference state information Pref will be described as a voltage profile indicating the voltage change of the reference cell according to the storage time.

The performance detecting device 130 may be configured to set the first state profile P1 for a predicted state of the battery based on the received battery information and the obtained environment information.

Preferably, the performance detecting device 130 may include an algorithm capable of setting a state profile for the battery based on the received battery information and the received environment information.

For example, a machine learning algorithm may be applied to the performance detecting device 130. In addition, when the battery information and the environment information are input, the performance detecting device 130 may set a state profile for the battery based on the input battery information and the input environment information. More specifically, a model learned to set a state profile for the battery when the battery information and the environment information are input may be preset in the performance detecting device 130.

For example, in the embodiment of FIG. 3, the performance detecting device 130 may set the first state profile P1 for the battery based on the battery information received from the battery information obtaining device 120 and the environment information received from the environment information measuring device 140. Also, the performance detecting device 130 may be configured to set the second state profile P2 based on the set first state profile P1 and the set reference state information Pref.

As described above, the reference state information Pref may be a voltage profile of the reference cell to which the environment information of the target location is reflected. That is, the reference state information Pref may be an actual voltage profile of the reference cell to which the environment information of the target location is directly reflected.

Accordingly, the performance detecting device 130 may be configured to set the second state profile P2 by correcting the set first state profile P1 according to the reference state information Pref That is, the performance detecting device 130 may set the second state profile P2 by fitting the first state profile P1 according to the reference state information Pref.

For example, in the embodiment of FIGS. 3 and 4, the performance detecting device 130 may calculate an average value of a voltage value Va of the first state profile P1 at the first time point t1 and a voltage value Vb of the reference state information Pref at the first time point t1. The average of the voltage values calculated for the first time point t1 may be a voltage value Vc of the second state profile P2. In this way, the performance detecting device 130 may set the second state profile P2 by calculating the average of the voltage values per time of the first state profile P1 and the reference state information Pref.

In the above, the embodiment in which the performance detecting device 130 sets the second state profile P2 as an average value of voltage values per hour of the first state profile P1 and the voltage value per time of the reference state information Pref has been described. However, the method in which the performance detecting device 130 sets the second state profile P2 based on the first state profile P1 and the reference state information Pref is not limited to the method of using an average of voltage values, and it should be noted that various methods may be applied to use, for example, the median value theorem, the mean square error, or the mean absolute error for voltage values per time.

Also, the performance detecting device 130 may be configured to detect the performance of the battery based on the set second state profile P2.

Specifically, the performance detecting device 130 may be configured to set the second state profile P2 at the first time point t1, and detect the performance of the battery by comparing the battery information received at the second time point t2 later than the first time point t1 with the predicted state of the second state profile P2 corresponding to the second time point t2.

For example, the performance detecting device 130 may set the second state profile P2 for the predicted state of the battery at the first time point t1 based on the received at least one battery information, the received at least one environment information, and the received at least one reference state information Pref. In addition, the performance detecting device 130 may detect the performance of the battery according to a result of comparing the battery information received at the second time point t2 with the predicted state according to the second state profile P2 at the second time point t2.

Figure 6:
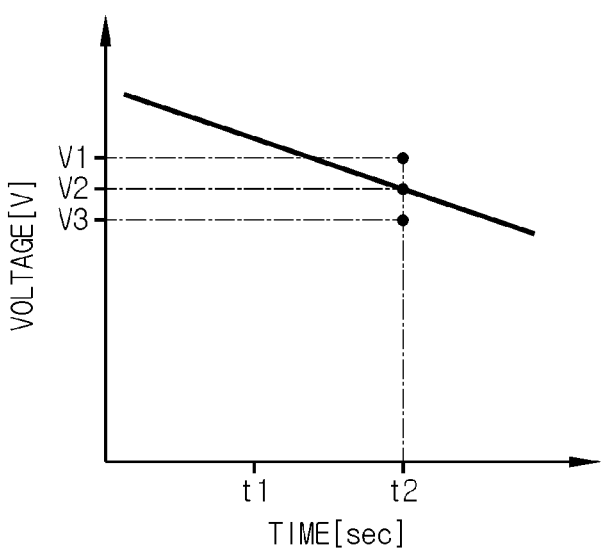
FIG. 6 is a diagram schematically showing an example of detecting the performance of a battery, in the system for managing a state of a battery according to an embodiment of the present disclosure.

FIG. 6 is a diagram schematically showing an example of detecting the performance of a battery, in the system for managing a state of a battery according to an embodiment of the present disclosure.

Specifically, FIG. 6 is an embodiment in which performance of the battery is detected according to battery state information measured at the second time point t2 after the second state profile P2 is set at the first time point t1.

First, in the embodiment of FIG. 6, it is assumed that the voltage value of the battery obtained by the battery information obtaining device 120 at the second time point t2 is the first voltage value V1, and the voltage value of the battery predicted by the second state profile P2 is the second voltage value V2. In this case, since the first voltage value V1, which is an actually measured voltage value, is larger than the second voltage value V2, which is a voltage value predicted according to the second state profile P2, the performance detecting device 130 may detect that the performance of the battery is normal performance or high performance.

Conversely, in the embodiment of FIG. 6, it is assumed that the voltage value of the battery obtained by the battery information obtaining device 120 at the second time point t2 is a third voltage value V3, and the voltage value of the battery predicted by the second state profile P2 is the second voltage value V2. In this case, since the third voltage value V3, which is an actually measured voltage value, is smaller than the second voltage value V2, which is a voltage value predicted according to the second state profile P2, the performance detecting device 130 may detect that the performance of the battery is low performance.

After that, the performance detecting device 130 may reset the first state profile P1 for the predicted state of the battery at the second time point t2, based on at least one battery information and at least one environment information received up to the second time point t2. In addition, the performance detecting device 130 may reset the second state profile P2 at the second time point t2 based on the reset first state profile P1 and the reference state information Pref. In addition, by using the reset second state profile P2, the performance of the battery may be detected according to the battery information received at a third time point later than the second time point t2.

The system 100 for managing a state of a battery according to an embodiment of the present disclosure may detect the performance of the battery based on the battery information, the environment information, and the reference state information Pref, and update the second state profile P2. That is, since the second state profile P2 for detecting the performance of the battery may be continuously updated based on latest information of the battery, the accuracy of detecting the performance of the battery by the system 100 for managing a state of a battery may be continuously improved.

As another embodiment of detecting the performance of the battery, the performance detecting device 130 may be configured to compare the set second state profile P2 with a reference profile and detect the performance of the battery according to the comparison result.

Here, the reference profile may be a degradation profile for a criterion cell of the same type as the battery. That is, the criterion cell is distinguished from the reference cell stored at the target location of the storage space 200, and may be a cell prepared to obtain a reference profile for the battery. Accordingly, the reference profile may be a profile to which the environment information of the target location is not reflected.

For example, the performance detecting device 130 may detect the performance of the battery according to a result of comparing the voltage value of the second state profile P2 with the voltage value of the reference profile. If the predicted voltage value according to the second state profile P2 is less than the reference voltage value according to the reference profile at any one time point, the performance detecting device 130 may detect that the performance of the battery at the corresponding time point is low performance. Conversely, if the predicted voltage value according to the second state profile P2 is greater than or equal to the reference voltage value according to the reference profile at any one time point, the performance detecting device 130 may detect that the battery performance at the corresponding time point is normal performance or high performance.

As another example, the performance detecting device 130 may compare a match rate between the set second state profile P2 and the reference profile, and detect the performance of the battery according to whether the match rate is equal to or greater than a predetermined rate. In particular, when the predicted voltage of the battery according to the second state profile P2 decreases faster than the voltage of the criterion cell according to the reference profile, the performance detecting device 130 may detect that the performance of the battery is low performance.

The performance detecting device 130 may be configured to determine the target location based on the received location information and determine at least one cell stored at the target location as the reference cell. In addition, the performance detecting device 130 may be configured to set the reference state information Pref corresponding to the determined reference cell.

Specifically, the performance detecting device 130 may determine a location at which the battery is stored among at least one cell stored in the storage space 200 as a target location. In addition, the performance detecting device 130 may determine at least one cell stored at the target location as a reference cell.

That is, the performance detecting device 130 may select a reference cell stored at a location adjacent to the battery among the cells stored in the storage space 200, and detect the performance of the battery based on the reference state information Pref of the selected reference cell. Therefore, since the interference of the environment of locations other than the target location may be reduced in the process of detecting the performance of the battery, the accuracy of detecting the performance of the battery by the system 100 for managing a state of a battery according to an embodiment of the present disclosure may be improved.

The reference cell may be configured to be provided in plural.

Specifically, a plurality of reference cells may be stored at the target location. For example, when the target location at which the battery is stored is the A section, a plurality of reference cells may be stored in the A section in advance.

The performance detecting device 130 may be configured to obtain a plurality of reference information respectively corresponding to the plurality of reference cells. Here, the reference information may be a degradation profile of each reference cell.

Referring to FIG. 1, the system 100 for managing a state of a battery according to an embodiment of the present disclosure may further include a storage device 150.

Here, the storage device 150 may store programs, data and the like required for the system 100 for managing a state of a battery to detect the performance of a battery. That is, the storage unit 130 may store data necessary for operation and function of each component of the system 100 for managing a state of a battery, data generated in the process of performing the operation or function, or the like. The storage device 150 is not particularly limited in its kind as long as it is a known information storage means that can record, erase, update and read data. As an example, the information storage means may include RAM, flash memory, ROM, EEPROM, registers, and the like. In addition, the storage device 150 may store program codes in which processes executable by the user terminal 110, the battery information obtaining device 120, the performance detecting device 130 and the environment information measuring device 140 are defined.

The storage device 150 may be configured to store reference information of each of at least one cell stored in the storage space 200. In addition, the storage device 150 and the performance detecting device 130 may be connected to communicate with each other.

The performance detecting device 130 may access the storage device 150 to obtain the reference information for each of the plurality of reference cells stored at the target location.

Also, the performance detecting device 130 may be configured to set the reference state information Pref for the target location based on the plurality of obtained reference information.

Specifically, the performance detecting device 130 may set one reference state information Pref for the target location by collecting the plurality of obtained reference information.

For example, it is assumed that five reference cells are stored in advance at the target location. The performance detecting device 130 may access the storage device 150 to obtain five reference information for five reference cells stored at the target location. In addition, the performance detecting device 130 may set one reference state information Pref for the target location based on the five obtained reference information.

As another example, it is assumed that one reference cell is stored in advance at the target location. The performance detecting device 130 may access the storage device 150 to obtain the reference information for one reference cell stored at the target location. In addition, the performance detecting device 130 may set one reference state information Pref for the target location based on one obtained reference information.

The performance detecting device 130 may set one reference state information Pref based on the plurality of reference information by using various methods without limitation, such as the mean value theorem, the median value theorem, the mean square error, or the mean absolute error.

Also, the performance detecting device 130 may be configured to set the second state profile P2 according to the set first state profile P1 and the set reference state information Pref.

That is, the second state profile P2 set by the performance detecting device 130 may be a profile set in consideration of not only the battery information and the environment information of the target location, but also the reference information of the plurality of reference cells stored at the target location.

Therefore, since the second state profile P2 is a profile set in consideration of the influence of the environment of the target location on the plurality of reference cells stored at the target location, the performance of the battery detected based on the second state profile P2 may be improved in accuracy and reliability.

The user terminal 110 may be configured to further set specification information for the battery.

For example, the specification information may be configured to include at least one of battery type, manufacturer, active material composition, and manufacturing time. However, the specification information of the battery that can be set by the user terminal 110 is not limited only by this embodiment, and, for example, more various information related to the specification of the battery such as maximum capacity of the battery may be set.

The performance detecting device 130 may be configured to receive the specification information from the user terminal 110 and determine a cell having the same specification as the received specification information among at least one cell stored at the target location as the reference cell.

Specifically, the performance detecting device 130 may select at least one cell stored at the target location from among the at least one cell previously stored in the storage space 200. In addition, the performance detecting device 130 may check the specification information of the selected at least one cell and determine at least one cell having the same specification information as the battery as the reference cell. Here, the specification information for the at least one cell stored in advance in the storage space 200 may be stored in advance in the storage device 150.

That is, in the process of detecting the performance of the battery, the performance detecting device 130 may more specifically consider the influence of the environment of the target location on the reference cell having the same specification information as the battery. Therefore, since the second state profile P2 may be set by reflecting the specification information of the battery, the accuracy of detecting the performance of the battery based on the second state profile P2 may be improved.

The user terminal 110 may be configured to further set a storage duration of the battery.

The battery information obtaining device 120 may be configured to receive the set storage duration from the user terminal 110.

For example, the communication unit of the user terminal 110 may be connected to communicate with the communication unit of the battery information obtaining device 120. In addition, the battery information obtaining device 120 may receive the set storage duration from the user terminal 110.

In addition, the battery information obtaining device 120 may be configured to set a wakeup period for the battery to obtain the battery information a predetermined number of measurement times during the set storage duration.

For example, in order to reduce unnecessary power consumption, the battery information obtaining device 120 may be configured not to always maintain a wakeup state. The battery information obtaining device 120 may be configured to obtain battery information by operating at every set wakeup period. That is, the wakeup period of the battery information obtaining device 120 may be set by the storage duration of the battery.

For example, the battery information obtaining device 120 may be set to measure battery information at least 100 times so that the performance of the battery may be detected at more various time points. In addition, the storage duration of the battery set by the user terminal 110 may be 100 hours. In this case, the battery information obtaining device 120 may set the wakeup period to 1 hour or less.

Preferably, the battery information obtaining device 120 may set the wakeup period to obtain battery information more than a predetermined number of measurement times. In the above embodiment, the battery information obtaining device 120 may set the wakeup period so that the battery information may be measured 101 times or more.

Therefore, since the battery information obtaining device 120 operates according to the wakeup period set according to the storage duration of the battery, unnecessary power consumption may be reduced, and sufficient battery information for detecting the performance of the battery may be secured.

Figure 7:
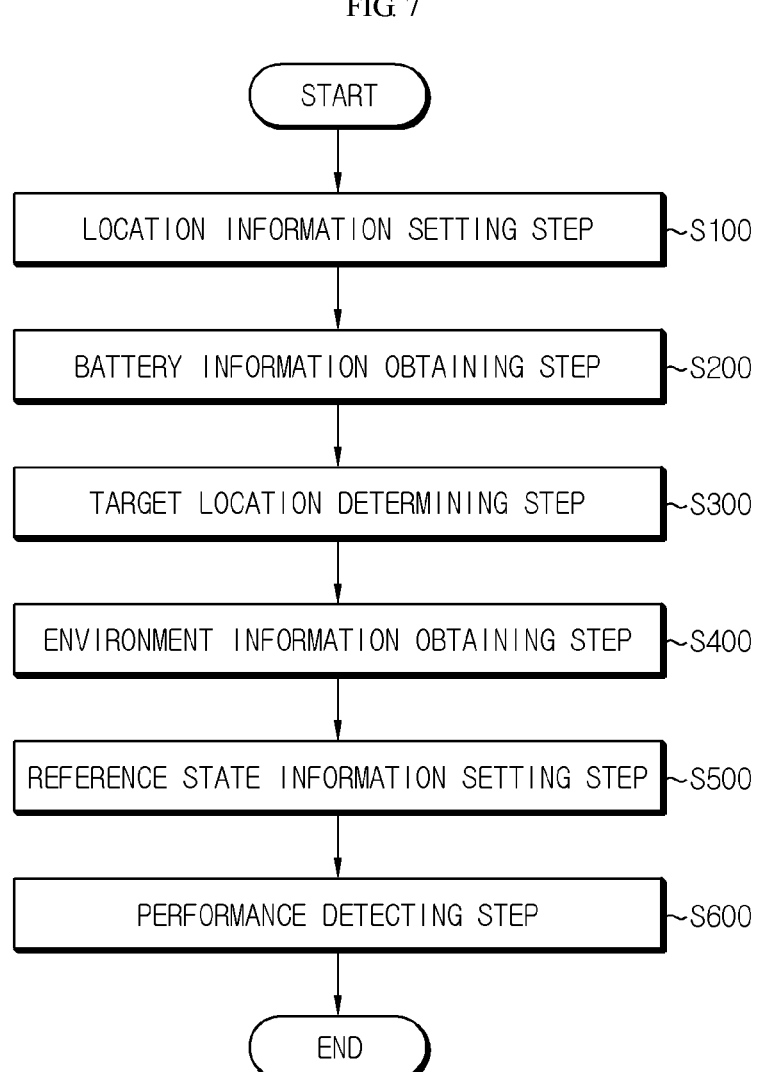
FIG. 7 is a diagram schematically showing method for managing a state of a battery according to another embodiment of the present disclosure.

FIG. 7 is a diagram schematically showing method for managing a state of a battery according to another embodiment of the present disclosure. Here, each step of the method for managing a state of a battery may be performed by the system 100 for managing a state of a battery.

Hereinafter, for convenience of description, the content overlapping with the previously described content will be omitted.

Referring to FIG. 7, the method for managing a state of a battery may include a location information setting step or operation (S100), a battery information obtaining step or operation (S200), a target location determining step or operation (S300), an environment information obtaining step or operation (S400), a reference state information setting step or operation (S500), and a performance detecting step or operation (S600).

The location information setting step (S100) is a step of setting location information for a location at which the battery is stored, and may be performed by the user terminal 110.

For example, the location information set by the user terminal 110 may be transmitted to the battery information obtaining device 120, the performance detecting device 130, the environment information measuring device 140, and the storage device 150.

The battery information obtaining step (S200) is a step of obtaining battery information including at least one of voltage, SOC, and SOH of the battery, and may be performed by the battery information obtaining device 120.

For example, in the battery information obtaining step (S200), the battery information obtaining device 120 may measure the voltage and/or current of the battery. In addition, the battery information obtaining device 120 may estimate the SOC and/or SOH of the battery based on the measured voltage and/or current.

The target location determining step (S300) is a step of determining the target location at which the battery is stored based on the location information set in the location information setting step (S100), and may be performed by the performance detecting device 130.

For example, in the embodiment of FIG. 2, it is assumed that the battery is stored in the A section among several sections divided in the storage space 200. The location information where the battery is stored by the user terminal 110 in the location information setting step (S100) may be set as the A section. In addition, in the target location determining step (S300), the performance detecting device 130 may determine the A section as a target location.

The environment information obtaining step (S400) is a step of obtaining environment information of the determined target location, and may be performed by the performance detecting device 130.

For example, when the battery is stored in the A section as in the above embodiment, the environment information measuring device 140 may measure the environment information for the A section. In addition, the performance detecting device 130 may obtain the measured environment information from the environment information measuring device 140.

The reference state information setting step (S500) is a step of setting the reference state information Pref of at least one reference cell stored around the determined target location, and may be performed by the performance detecting device 130.

For example, when a plurality of reference cells are provided at the target location, the performance detecting device 130 may obtain reference information of each of the plurality of reference cells, and set one reference state information Pref for the target location by collecting the plurality of obtained reference information.

The performance detecting step S600 is a step of detecting the performance of the battery based on at least one of the battery information, the environment information, and the reference state information Pref, and may be performed by the performance detecting device 130.

Specifically, the performance detecting device 130 may set the first state profile P1 based on the battery information and the environment information. In addition, the performance detecting device 130 may set the second state profile P2 by correcting the first state profile P1 according to the reference state information Pref. In addition, the performance detecting device 130 may detect the performance of the battery by comparing the predicted state of the battery according to the second state profile P2 with the actually measured state of the battery.

The embodiments of the present disclosure described above are not necessarily implemented by a system and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

100: system for managing a state of a battery
110: user terminal
120: battery information obtaining device
130: performance detecting device
140: environment information measuring device
150: storage device
200: storage space

What is claimed is:

1. A system for managing a state of a battery, the system comprising:

a user terminal configured to set location information about a location at which the battery is stored and output the set location information;

a battery information obtaining device connected to the battery and configured to obtain battery information including at least one of voltage, state of charge (SOC), and state of health (SOH) of the battery and output the obtained battery information; and a performance detecting device connected to the user terminal to receive the set location information, connected to the battery information obtaining device to receive the obtained battery information, and configured to determine a target location at which the battery is stored based on the received location information, obtain environment information of the determined target location, set reference state information of at least one reference cell stored around the determined target location, and detect performance of the battery based on at least one of the obtained battery information, the obtained environment information, and the set reference state information, wherein the performance detecting device is configured to set a first state profile about a predicted state of the battery based on the obtained battery information and the obtained environment information, set a second state profile about the predicted state of the battery based on the set first state profile and the set reference state information at a first time point, and detect the performance of the battery based on the set second state profile at a second time point later than the first time point.

2. The system for managing a state of a battery according to claim 1, wherein the performance detecting device is configured to set the second state profile by correcting the set first state profile according to the reference state information.

3. The system for managing a state of a battery according to claim 2, wherein correcting the set first state profile includes setting the second state profile by fitting the first state profile according to the reference state information.

4. The system for managing a state of a battery according to claim 1, wherein the performance detecting device is configured to set the second state profile at a first time point and detect the performance of the battery by comparing battery information received at a second time point later than the first time point with the predicted state of the battery according to the second state profile corresponding to the second time point.

5. The system for managing a state of a battery according to claim 1, wherein the performance detecting device is configured to compare the set second state profile with a reference profile and detect the performance of the battery according to a comparison result.

6. The system for managing a state of a battery according to claim 1, wherein the performance detecting device is configured to determine the target location based on the received location information, determine at least one cell stored at the target location as the at least one reference cell, and set reference state information corresponding to the determined reference cell.

7. The system for managing a state of a battery according to claim 6, wherein the at least one reference cell is provided in plural, and wherein the performance detecting device is configured to obtain a plurality of reference information respectively corresponding to the plurality of reference cells, set the reference state information about the determined target location based on the plurality of obtained reference information, and set the second state profile according to the set first state profile and the set reference state information.

8. The system for managing a state of a battery according to claim 6, wherein the user terminal is configured to further set specification information about the battery, and wherein the performance detecting device is configured to receive the specification information from the user terminal and determine a cell having the same specification as the received specification information among the at least one cell stored at the determined target location as the at least one reference cell.

9. The system for managing a state of a battery according to claim 8, wherein the specification information is configured to include at least one of battery type, manufacturer, active material composition, and manufacturing time.

10. The system for managing a state of a battery according to claim 1, wherein the user terminal is configured to further set a storage duration of the battery, and wherein the battery information obtaining device is configured to receive the set storage duration from the user terminal, set a wakeup period about the battery so that the battery information is obtained a predetermined number of measurement times during the set storage duration, and obtain the battery information by operating at every set wakeup period.

11. The system for managing a state of a battery according to claim 1, wherein the user terminal is configured to set a target section in which the battery is stored as the location information among a plurality of divided sections of a storage space.

12. The system for managing a state of a battery according to claim 1, further comprising:

an environment information measuring device configured to measure the environment information including at least one of temperature, humidity, and air quality of the determined target location, and transmit the measured environment information to the performance detecting device.

13. The system for managing a state of a battery according to claim 1, wherein the performance detecting device detects that the performance of the battery based on the set second state profile at the second time point is one of normal performance, high performance and low performance based on a rate of the second state profile.

14. A method for managing a state of a battery, the method comprising:

a location information setting operation of setting location information about a location at which the battery is stored;

a battery information obtaining operation of obtaining battery information including at least one of voltage, state of charge (SOC), and state of health (SOH) of the battery;

a target location determining operation of determining a target location at which the battery is stored based on the location information set in the location information setting operation;

an environment information obtaining operation of obtaining environment information of the determined target location;

a reference state information setting operation of setting reference state information of at least one reference cell stored around the determined target location;

a performance detecting operation of detecting performance of the battery based on at least one of the battery information, the environment information, and the reference state information;

a first state profile setting operation of setting a first state profile about a predicted state of the battery based on the obtained battery information and the obtained environment information; and a second state profile setting operation of setting a second state profile about the predicted state of the battery based on the set first state profile and the set reference state information at a first time point, wherein the performance detecting operation further comprises detecting the performance of the battery based on the set second state profile at a second time point later than the first time point.

15. The method according to claim 14, wherein the performance detecting operation detects that the performance of the battery based on the set second state profile at the second time point is one of normal performance, high performance and low performance based on a rate of the second state profile.

\* \* \* \* \*